United States Patent
Wang et al.

(10) Patent No.: US 7,354,623 B2
(45) Date of Patent: Apr. 8, 2008

(54) SURFACE MODIFICATION OF A POROUS ORGANIC MATERIAL THROUGH THE USE OF A SUPERCRITICAL FLUID

(75) Inventors: Ching-Ya Wang, Hsin-Chu (TW); Ping Chuang, Tao-Yuan (TW); Sunny Wu, Hsin-Chu (TW); Yu-Liang Lin, Hsin-Chu (TW); Hung-Jung Tu, Hsin-Chu (TW); Mei-Sheng Zhou, Singapore (SG); Henry Lo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 808 days.

(21) Appl. No.: 10/852,381

(22) Filed: May 24, 2004

(65) Prior Publication Data

US 2005/0260402 A1    Nov. 24, 2005

(51) Int. Cl.
   *B05D 3/00*     (2006.01)
   *B05D 5/00*     (2006.01)
(52) U.S. Cl. .................... 427/336; 427/307; 427/99.3; 427/399; 427/400

(58) Field of Classification Search ................ 427/307, 427/336, 99.3, 399–400
   See application file for complete search history.

(56) References Cited

U.S. PATENT DOCUMENTS

| | | | |
|---|---|---|---|
| 4,594,311 A * | 6/1986 | Frisch et al. ................. 430/315 |
| 5,185,296 A | 2/1993 | Morita et al. |
| 5,304,515 A | 4/1994 | Morita et al. |
| 5,665,527 A | 9/1997 | Allen et al. |
| 5,710,187 A * | 1/1998 | Steckle et al. ................. 521/64 |
| 6,194,650 B1 * | 2/2001 | Wakayama et al. ......... 136/256 |
| 6,329,017 B1 | 12/2001 | Liu et al. |
| 6,444,715 B1 | 9/2002 | Mukherjee et al. |
| 6,875,709 B2 * | 4/2005 | Lin et al. ..................... 438/781 |
| 6,989,172 B2 * | 1/2006 | DeYoung et al. ............. 427/58 |

* cited by examiner

*Primary Examiner*—Timothy Meeks
*Assistant Examiner*—David Turocy
(74) *Attorney, Agent, or Firm*—Slater & Matsil, L.L.P.

(57) ABSTRACT

An organic layer, such as a porous low-K dielectric in an IC, contains pores open at its surface. To close the pores, the organic layer is contacted by a supercritical fluid that is a solvent for the layer. After a small amount of the surface and the wall of the open pores is solvated, a phase transition of the solvated organic material is effected at the surface to cover it with a dense, smooth, non-porous film that seals the open pores.

14 Claims, 4 Drawing Sheets

SURFACE MODIFICATION OF A POROUS ORGANIC MATERIAL THROUGH THE USE OF A SUPERCRITICAL FLUID

TECHNICAL FIELD

The present invention relates to the surface modification of a porous organic material through the use of a supercritical fluid. More particularly, the present invention relates to forming a very thin, dense layer on a free surface of a body or film that is made of or contains a porous organic material to render the surface smooth or non-porous and the body or film mechanically stronger.

BACKGROUND

Porous organic structures, such as a body or film thereof, or structures containing porous organic materials find a variety of industrial uses. Such porous structures are usually mechanically weaker than would be the case if the pores were not present. Moreover, the pores of the structures often intersect the free surfaces thereof, rendering that surface rough, non-uniform or erose. Some potential uses of these porous structures require that the porous structure be rendered mechanically stronger and/or that the free surfaces thereof be smooth and non-erose. One use having these requirements involves the porous structures acting as a dielectric layer in an integrated circuit ("IC").

Efforts proceed to increase the density of integrated circuits on a single substrate. Circuit density increase requires decreasing the size of integrated circuit features to the low nanometer range. To achieve significant shrinkage in the size of integrated circuit features, new or improved, high-purity, low-K dielectric materials are required to address capacitance-related problems, such as increased power consumption, signal propagation delays and crosstalk between the circuits' conductors and interconnects.

One prospective class of low-K dielectric materials includes porous organic or organic-containing structures into which there have been introduced a high density of nanopores. Typically, these structures comprise thin layers or films containing a large number of small pores or voids that may be open or closed, the latter being preferred. Porous layers or films are deposited or otherwise produced on the substrate for later receipt therein and thereon of the conductors (or lines), pads and interconnects of the integrated circuit supported by the substrate. The pores effect a lowering of the K (dielectric constant or relative permittivity) of the layer or film. Whether the pores of the layer or film are open or closed, some of them typically intersect, and are open at, the free surface of the layer or film.

Metallic conductors of integrated circuits typically begin as metallic patterns on a free surface of the low-K, organic layer or film. The free surface may be a surface of the as-formed layer or a surface exposed after etching of the layer. The metallic patterns are produced by a deposition process such as electroplating a metal layer onto a seed layer of the metal. The seed layer is typically formed by physical vapor deposition ("PVD") of metal onto a previously deposited barrier layer. The barrier layer is intended to prevent untoward reaction of the atoms or ions of the metal forming the seed layer or the conductor with the material of the organic layer. The free surface may be a generally planar portion of the surface of the layer or film, but more typically comprises the bottom and sidewalls of a conductor-containing trench formed in the organic layer by etching. The metal seed layer and the deposited metal may enter, and contact the walls of pores open at the free surface of the organic layer due to failure of the barrier layer to cover those pore walls. This creates the possibility of unwanted metal-layer reactions. The presence of metal in the pores has also been found to have deleterious effects on integrated circuit operation, particularly in the areas of crosstalk between and among the conductors and the concomitant waste of power. Further, whether or not the barrier layer fully covers the walls of open pores, the seed layer may fail to fully enter some pores. In this event, during the electroplating process, a void in the conductor will occur where no continuous seed layer is present. Such voids may increase the electrical resistance of the conductor to unacceptable levels or, if one or more voids migrate and/or merge, open (render discontinuous) the conductor.

It is desirable that low-K dielectric films in ICs be mechanically strong, especially where metal conductors, having diverse thermal coefficients of expansion, are contained and constrained in trenches. As noted, the presence of pores mechanically weakens dielectric films. Additionally, pores in the dielectric film may have an adverse or unpredictable effect on the thermal expansion coefficient of the film. Pores open at the free surface of the film may increase the moisture uptake of the film and decrease the purity of the film and the adhesion of the film to the underlying surface on which it resides In view of the foregoing regarding the use of porous dielectric films in IC fabrication, it may be said that, while porosity can impart to a dielectric film a desirable low K, porosity can also have deleterious effects on the quality of the films and or conductors formed therein and thereon.

Supercritical fluids, such as supercritical carbon dioxide ("$SCCO_2$") are well defined in the art. Supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Due to their high density, low viscosity and negligible surface tension, supercritical fluids possess superior solvating properties.

Supercritical fluids ("SCF") have been known for over 200 years. Presently SCFs are used to clean extremely small items, in thin film processing and in other applications as developer reagents or extraction solvents. U.S. Pat. Nos. 5,185,296 and 5,304,515 describe methods in which supercritical fluids are used to remove unwanted organic solvents and impurities from thin films deposited on substrates. U.S. Pat. No. 5,665,527 describes a high resolution lithographic method in which a supercritical fluid is used to selectively dissolve a soluble unexposed portion of a polymeric material (a photoresist) from a substrate, thereby forming a patterned image. In recognition of the superior solvating properties of supercritical fluids, U.S. Pat. No. 5,710,187 describes a method for removing impurities from highly cross-linked porous organic polymers. A key function of the supercritical solvent is to penetrate the nanoporous structure effectively so as to remove all traces of organic solvents and unreacted monomer.

The desirability of sealing or closing, or otherwise eliminating, the open pores intersecting the free surface of the organic layer has been recognized for some time in the IC arena. Effective procedures for achieving this goal without compromising the properties of the film as they relate to integrated circuit fabrication are the subject of continuing work in the field. The present invention presents such an effective procedure.

SUMMARY OF THE INVENTION

The present invention contemplates a method of producing a very thin, dense, pore-free layer on a free surface of a structure. The structure, which may be a body, film or layer is made of or contains a porous organic material. In specific embodiments, the structure is a low-K dielectric organic layer of an IC. Some of the pores, which may be opened or closed within the structure, are typically very small (nanopores) and have a high density in the structure. Some of the pores intersect, and are open at, a free surface of the structure.

The method of the present invention contemplates contacting the free surface of the structure with a supercritical fluid that includes a solvent for the organic material under conditions sufficient to initiate solvation of the surface and the walls of pores open at the surface. Conditions are then imposed under which the solvating organic material undergoes a phase transition at the free surface to form on the surface and over the pores open thereat a very thin, dense layer of the organic material to render the surface smooth. Where the structure is a dielectric in an IC, the dense layer is sufficiently thin so that the K of the film is not significantly increased.

In some embodiments the supercritical fluid itself is the solvent. In other embodiments the supercritical fluid and the solvent are separate entities. The phase transition of the solvating material may be effected by lowering the temperature of the supercritical fluid or by adding a non-solvent for the material to the supercritical fluid.

The present invention also contemplates a product resulting from the foregoing method.

BRIEF DESCRIPTION OF THE DRAWINGS

None of the following Figures are to scale and are exaggerated and stylized to more clearly illustrate the principles of the present invention.

DETAILED DESCRIPTION OF ILLUSTRATIVE EMBODIMENTS

Figure 1:
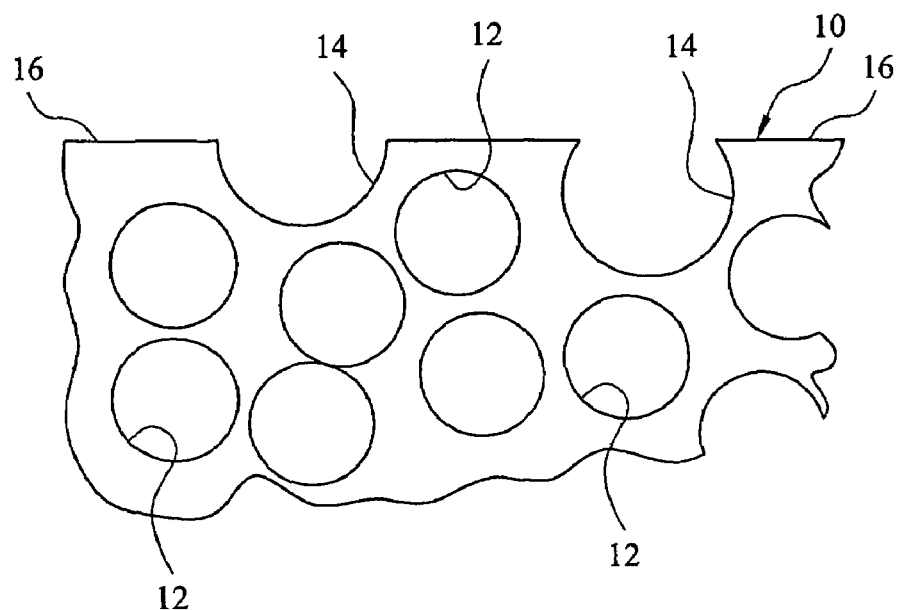
FIG. 1 is an enlarged, stylized, cross-sectioned view of an organic, porous material structure.

FIG. 1 depicts a structure 10, which comprises a solid organic material having small pores 12 dispersed therethrough. The structure 10 may be a relatively large, self-supporting body of the organic material or a thin layer of the organic material deposited on or applied to a substrate (not shown). The structure 10 may also comprise a self-supporting body or a substrate-supported thin layer, either of which may include the organic material and other organic or inorganic substances.

The pores 12 are depicted as being closed, that is, not in communication with each other, but open pores communicating with each other are contemplated. Some of the pores 14 intersect a free surface 16 of the structure rendering the surface 16 non-smooth, rough or erose. These open pores 14 may occur in the as-formed structure 10 or may result from etching or other treatment of the surface 16. For some proposed uses of the structure 10, it is desired that the free surface 16 be smooth and non-erose, that is containing no sites whereat pores intersect its free surface 16.

Porous structures such as the structure 10 containing pores 12 are not as mechanically strong as would be a structure of the same material without the pores. Mechanical strength is generally inversely proportional to the density of pores 12 within the structure 10. For certain contemplated uses of the structure 10, it is desired to increase mechanical strength of the structure 10 without substantially altering other properties thereof 10.

Many organic materials are good electrical insulators and possess a low dielectric constant or K. The presence of small pores 12 can further lower the K of a material. Accordingly, a particular use contemplated for the structure 10 by the present invention is that as an insulative, low-K dielectric in an integrated circuit ("IC"). As the size of ICs decreases, the need for good electrical insulation having a low K increases. Porous structures 10 applied or deposited on various layers of ICs have, therefore, been found expedient, if not necessary, to use as insulation and/or a dielectric between conductors (lines and pads) of ICs and to decrease capacitance between these conductors, as discussed earlier. Such a use is schematically shown in FIG. 2A.

Figure 2A:
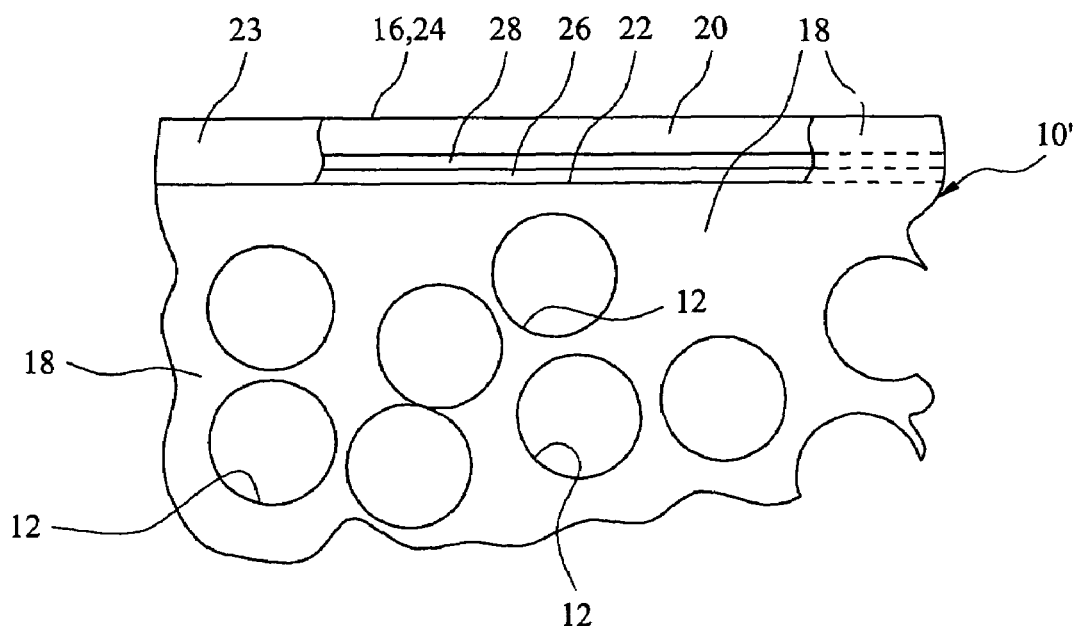
FIG. 2 includes three highly enlarged, stylized, cross-sectioned views of a portion of the structure of FIG. 1 acting as a dielectric layer in an IC and illustrating defects that may deleteriously affect the IC due to pores intersecting the surface of the layer which render it non-smooth.

In FIG. 2A, an idealized structure 10' comprises a thin, porous organic layer 18 residing on a lower level of an IC or other substrate (not shown). The structure 10' is said to be idealized, because none of the pores 12 are shown to intersect the free surface 16 of the organic layer 18. When used as an insulator and dielectric in ICs, the pores 12 are quite small, having dimensions in the nano-meter range, and are often termed nano-pores.

A line 20 or other conductor, such as a pad or electrode, of the IC is supported by the organic layer 18. Typically, the line 20 resides in an etched trench, the free surface of the bottom 22 of which and a portion of one sidewall 23 are shown in FIG. 2A. The trench physically constrains the line 20 between its sidewalls 23. If damascene protocols are followed in fabricating the IC, the line 20 is copper which is deposited on the structure 10 by overfilling the trench and then planarizing the overfill by chemical-mechanical polishing ("CMP") until the top 24 of the line 20 is coplanar with the free surface 16 of the organic layer 18.

The steps effected to produce the line 20 are to first deposit a tantalum-containing barrier layer 26 on the bottom 22 and sidewalls 23 of the trench, as well as on the free surface 16 of the organic layer 18. The barrier layer 26 prevents copper atoms or ions from the line 20 from diffusing into the organic layer 18. Diffusion of copper into the layer 18 compromises and degrades both its insulative and dielectric properties. For example, diffusion of copper into the organic layer 18 has been found to increase the desirably low K of the layer 18. Metals other than copper may not require the barrier layer 26. The barrier layer 26 is deposited in any conventional manner.

A copper seed layer 28 is then deposited on the barrier layer 26 by physical vapor deposition ("PVD") or other conventional method, on the bottom 22 and sidewalls 23 of the trench and on the barrier layer-covered surface 16 of the organic layer 18. Thereafter, the copper line 20 is electrodeposited on the seed layer 28, overfilling the trench and covering the surface 16 with copper. Subsequent planarization removes the overfill of copper, the copper seed layer 28 and barrier layer 26 from the surfaces 16, 22 and 23.

Figure 2B:
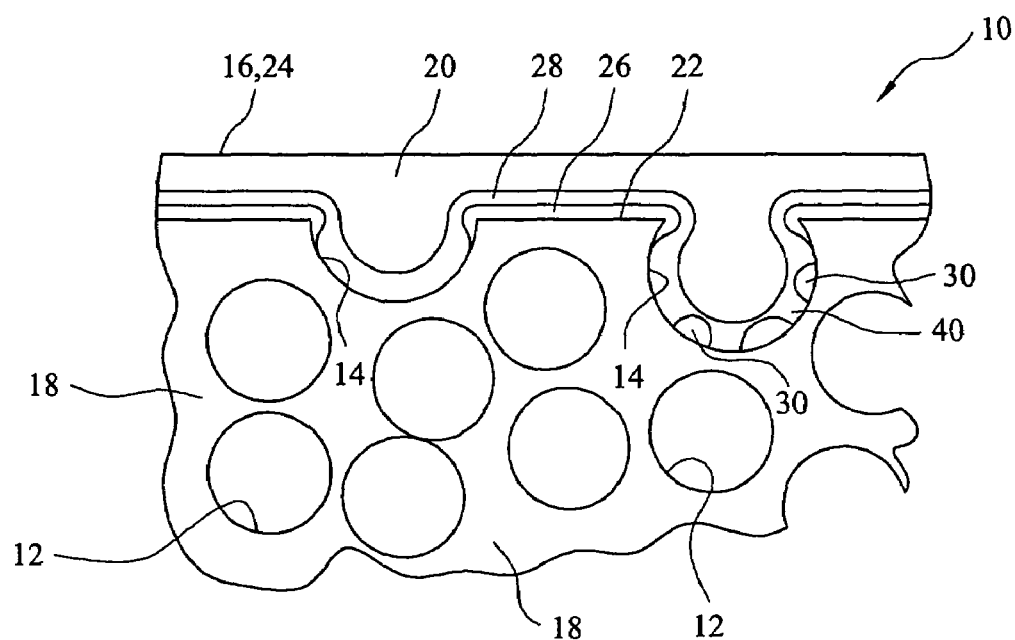
Figure 2C:
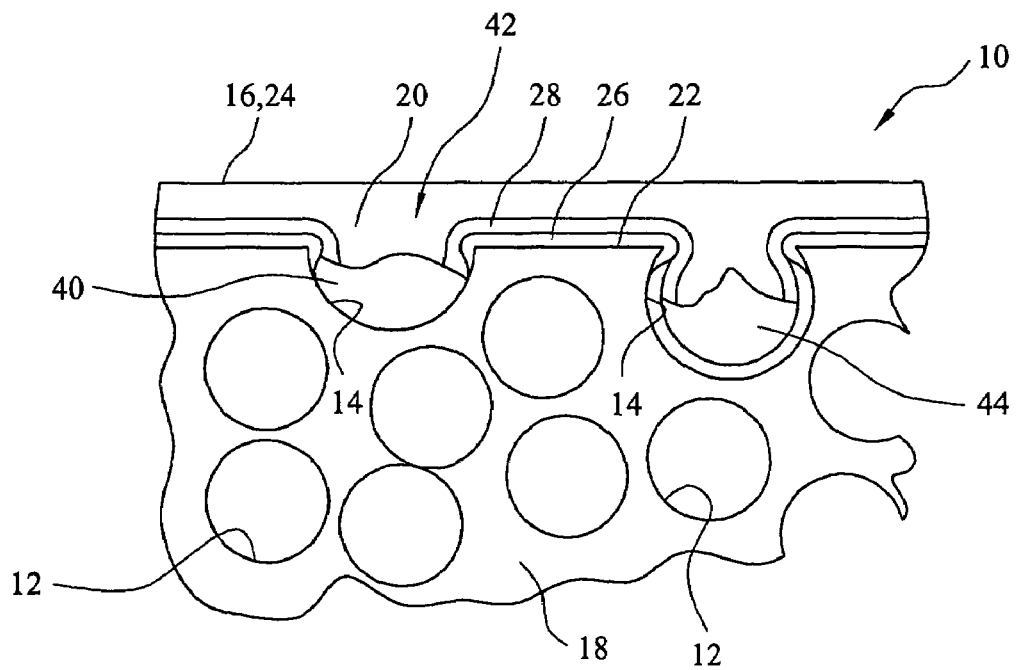

In reality, some of the nano-pores 14 of the structure 10 in FIG. 1 and of the organic layer 18 of FIGS. 2B and 2C intersect the free surface 16 of the structure 10 and the sidewalls 23 and bottom 22 of the trench etched into the organic layer 18. These intersections of nano-pores 14 with these surfaces can be deleterious to the insulative and dielectric quality of the structure 10, and particularly of the organic layer 18, and can prevent proper operation of an IC in which the organic layer 18 is present.

Specifically, and referring to the left-hand portion of FIG. 2B, there is depicted a situation where, because of the small size of the pores 14 intersecting, and open at the surface of, the trench bottom 22 or the sidewalls 23, the barrier layer 26 has not fully covered the wall of some of the open cells 14. However, the PVD seed layer 28 has covered these walls. Consequently, when the copper for the line 20 is electrodeposited, the pores 14 are filled therewith. As described above, direct contact between the organic layer 18 and copper of the seed layer 28 or the line 20 can adversely affect the insulative and dielectric properties of the organic layer 18. Moreover, even absent diffusion of copper into the organic layer 18, a copper asperities in a pore 14 is closer to other conductors than intended, and the capacitive effects thereof may produce cross-talk or other deleterious consequences in the IC.

At the right in FIG. 2B, a related situation exists wherein the seed layer 28 in the open pore 14 is not continuous, but copper grains 30 have been deposited on the wall of the pore 14 during the PVD process. Both copper contamination, discussed above, and a void 40, discussed below, may occur At the left of FIG. 2C, the small size of one open pore 14 has led to both the barrier layer 26 and the seed layer 28 from covering the wall of the pore 14. Electroplated copper will, thus, not fill the pore 14 thereby creating a small void 40 in the pore 14 beneath the line 20. Such voids 40, it has been found, may migrate into the line 20 increasing its electrical resistance or causing a mechanically weakened point. Void formation and migration are accelerated by typical post-deposition annealing of the line 20. Because the thermal expansion coefficients of copper and the organic layer 18 are different, and because the bottom 22 and sidewalls 23 of the trench constrain the line 20, annealing, as well as thermal cycling of the IC which typically occurs during IC operation, may fracture or tear the line 20.

Reference numeral 42 at the left in FIG. 2C is a location where the seed layer 26 has slightly entered the pore 14, and the electrodeposited copper has been deposited thereon in close proximity with or in contact with the wall of the pore 14. This, again, raises also the possibility of degradation of the organic layer 18 by diffusion of the copper thereinto.

At the right of FIG. 2C, the barrier layer 26 has covered the wall of the pore 14, but the seed layer 28 has only partially covered the wall of the pore 14. While contamination of the organic layer 18 by copper may well be avoided, the resulting void 44 may lead to IC failure, as described above.

If the organic material of the layer 18 contained no pores 12,14, its relatively higher mechanical strength could be sufficient for its trenches to properly constrain the lines 20, notwithstanding their variant coefficients of thermal expansion. The pores 12,14 may sufficiently lower this constraining ability to permit the line 20 to buckle, creating the possibility of IC failure.

The present invention provides a method of eliminating the open pores 14 at surfaces 16, 22 and 23 of the organic layer 18, thus negating the above-described degradation of the insulative and dielectric qualities of the low-K organic layer 18. Additionally, the present invention results in an increase of the mechanical strength of the porous organic layer 18 without significantly increasing the dielectric constant or K of the layer 18.

Figure 3A:
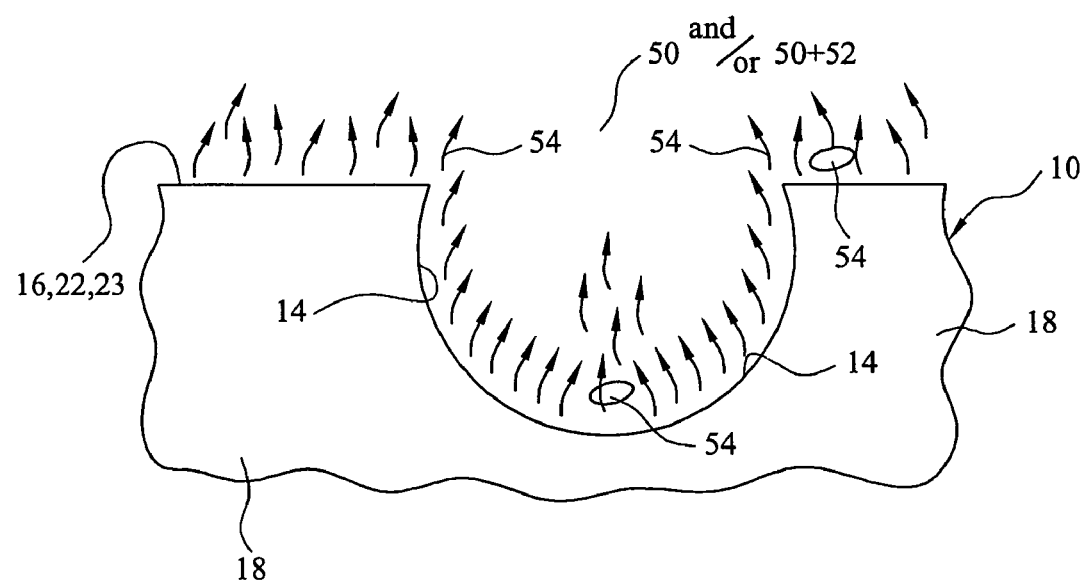
FIG. 3 includes three schematic representations illustrating a process according to the present invention wherein a non-smooth surface of the structures of FIGS. 1 and 2 is rendered smooth.
Figure 3B:
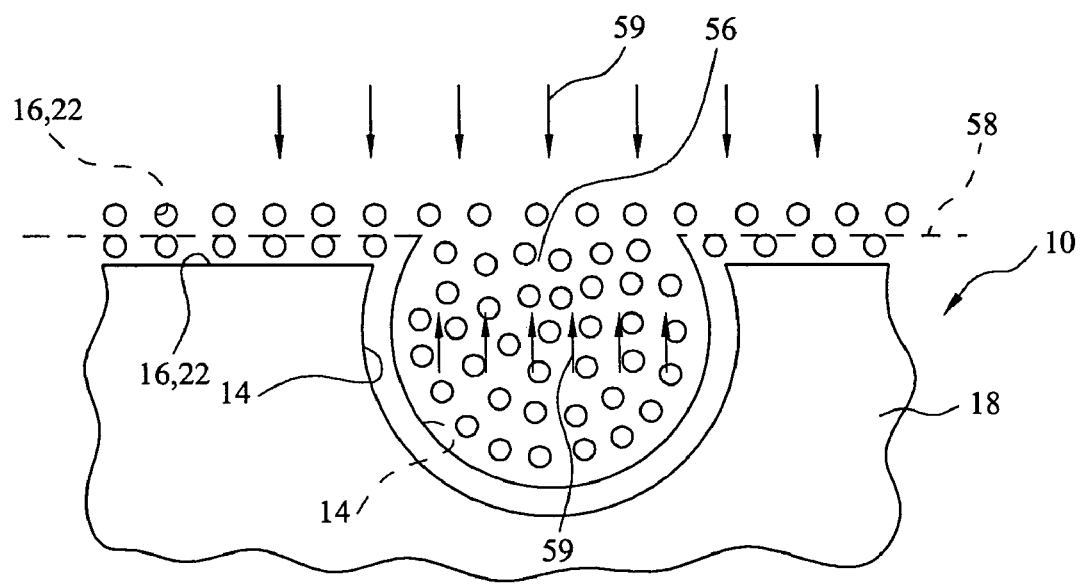
Figure 3C:
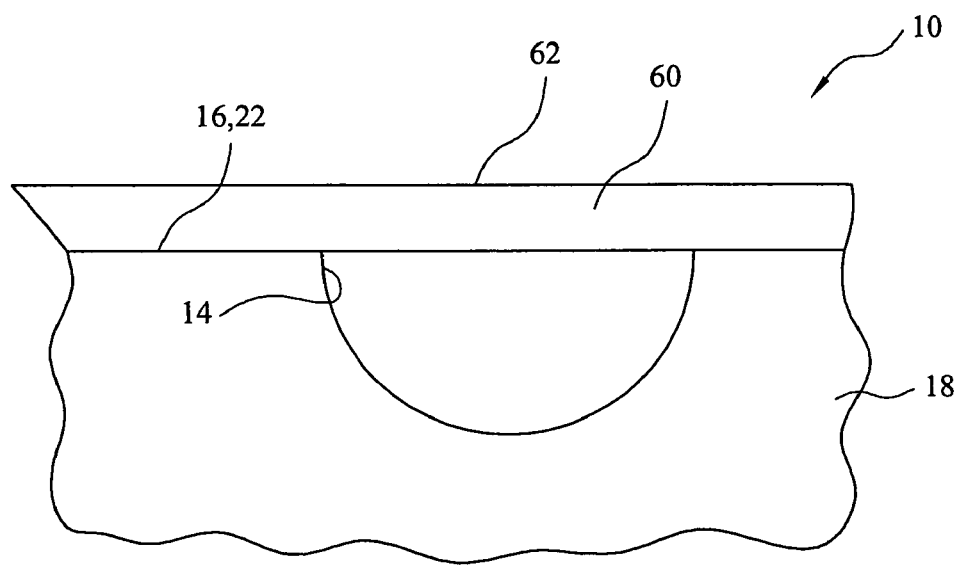

Referring now to FIGS. 3A-3C, the method of the present invention is schematically shown. These Figures depict a single pore 14 open at a surface 16, 22 or 23 of the organic layer 18 and in a stylized manner illustrate the present method and its effects.

The organic layer 18, or any other structure 10 that is a porous organic body, is contacted by a supercritical fluid 50 that is appropriately compressed and held at a suitable temperature to ensure supercriticality in a conventional manner. The supercritical fluid 50 may itself be a solvent for the organic layer 18, and/or there may be added to the supercritical fluid 50 a solvent or co-solvent 52 for the layer 18. The solvent or co-solvent 52 is preferably added to the supercritical fluid 50 at the inception of supercriticality but may be added after supercriticality of the fluid 50 has been initiated.

As is well known, a supercritical fluid has low (to zero) surface tension, a density similar to that of its liquid state, and a viscosity and diffusivity closer to its gaseous state. Supercritical fluids have been used to clean micro- and nano-machines, because of their ability to penetrate into small spaces (due to low viscosity and high diffusivity) and dissolve or remove by momentum transfer (due to high density) impurities and unwanted particles.

The supercritical fluid 50 alone (if, by itself, it is a solvent for the layer 18) or the supercritical fluid 50 plus a solvent or co-solvent 52 (whether or not the supercritical fluid 50 itself is a solvent for the layer 18) enter the small pore 14. The supercritical solvent 50 or 50+52 initiates solvation of the surface 16, 22 or 23 of the layer 18 and the wall of the pore 14. During solvation, molecules of the layer 18 move away from the surface 16, 22 or 23 and from the wall of the pore 14, as indicated by the arrows 54, and the surface 16, 22 or 23 and the wall of the pore 14 recede. Ultimately, as shown in FIG. 3B, a "cloud" 56 of these solvated and solvating molecules is present near the surface 16, 22 or 23 and at the mouth of the open pore 14. The dotted profile 58 represents the original surface 16, 22 or 232 and the original wall of the pore 14.

Again, as is well known, the supercritical state of a fluid is highly sensitive to both temperature and pressure, and different liquids may have vastly different temperature and pressure points at which they become supercritical. Accordingly, after a time dependent on the specific organic material of the layer 18 and the constituents of the solvent 50 or 50+52, the supercritical state of the solvent 50 or 50+52 is abruptly terminated by either lowering its temperature or its pressure or both, or by adding to it a sufficient quantity of non-solvent for the layer 18. As used herein, the term "non-solvent" means a liquid or fluid having a different supercriticality point than the solvent 50 or 50+52.

The abrupt termination of the supercritical state of the solvent 50 or 50+52 effects a phase transition of the molecules in the cloud 56 at the surface 16, 22 or 23, as indicated by the arrows 59. Immediately thereupon, as shown in FIG. 3C, a thin, dense, non-porous film or membrane 60 of the organic material forms atop the surface 16, 22 or 23 and over the entry to the pore 14. Concerning the phase transition and the formation of the film 60, see *Basic Principles of Mem-*

*brane Technology 2$^{nd}$ Edition*, by Marcel Mulder, October 1996, Kluwer Academic Publishers, ISBN 0792342488, incorporated by reference hereinto.

The film or membrane 60 has a higher density than that of the remainder of the layer 18. The boundary between the film 60 and the less dense, porous remainder of the layer 18 is defined primarily by a density transition therebetween, although in FIGS. 3C and 4 the boundary is shown as the surface 16,22 or 23. The film 60 closes the pores 14 open at the surface 16,22 and 23 and adds mechanical strength to the organic layer 18. The film or membrane 60 has also been found to be sufficiently thin so as to not significantly increase the dielectric constant, K, of the low-K layer 18. The free surface 62 of the film 60 is smooth and is suitable to serve as a surface onto which a barrier layer 26, a seed layer 28 and a line 20 or other conductor may be formed without the deficiencies of a line 20 deposited pursuant to the prior art.

Typically, the preferred solvent 50 will be supercritical $CO_2$, as it is known as a solvent for many materials. See for example the above-cited patents and "Precision Cleaning with Supercritical Carbon Dioxide for the elimination of Organic Solvents and Reduction of Hazardous Waste," by Spall et al. in the Proceedings of the 1995 Summer National Meeting of the AlChe. Where the solvent 50+52 is used, it will usually be preferred to use a co-solvent together with $CO_2$.

Figure 4:
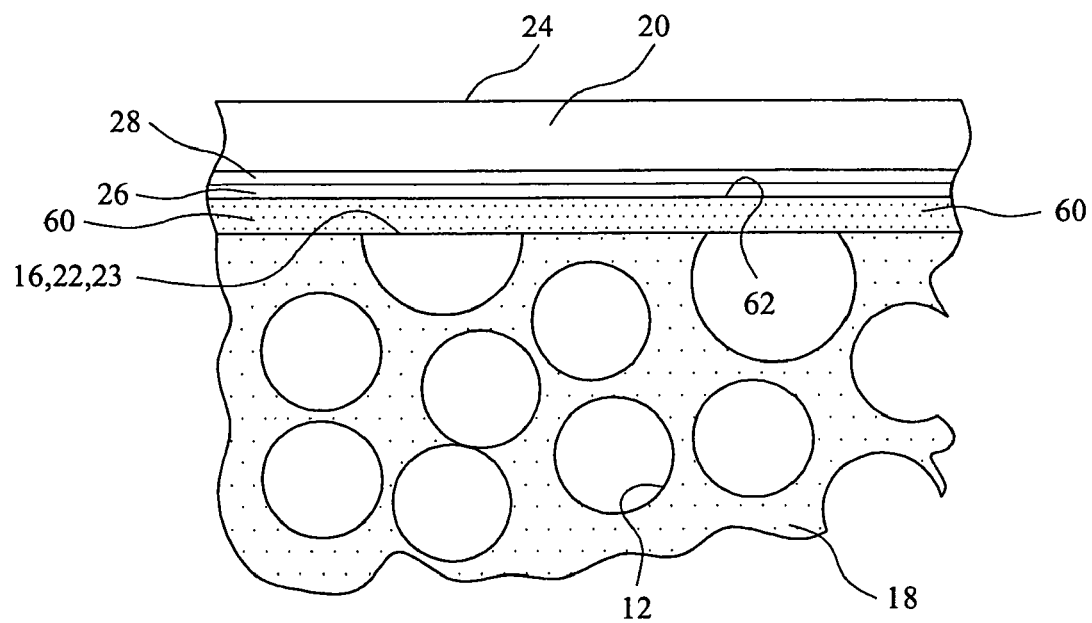
FIG. 4 is a highly enlarged, stylized, cross-sectioned view of the organic structures of FIGS. 1 and 2 the surfaces of which have been rendered smooth by the process depicted in FIG. 3 so as to be suitable for use in an IC.

One example of an organic material for the structure 10 of FIG. 1 or the layer 18 of FIGS. 2-4 is polytetrafluoroethylene ("PTFE") or Teflon® (Dupont) containing small pores 12 and 14. Supercritical $CO_2$ solvates PTFE. Accordingly, the $CO_2$ solvent 50 is rendered supercritical and brought into contact with the surface 16, 22 or 23 of the organic layer 18 until the cloud 56 of PTFE molecules is present. A phase transition of the PTFE molecules 56 may be effected by adding to, or flushing, the supercritical $CO_2$ with additional $CO_2$ below the supercritical temperature. The phase transition may also be effected by adding water to the supercritical $CO_2$. Water is a non-solvent for PTFE at the temperature and pressure that renders $CO_2$ supercritical.

Alternatively, where the structure 10 or the layer 18 is composed of PTFE. The supercritical fluid solvent 50 may be a fluorine-containing substance such as HF. The phase transition may be effected by adding HF below its supercritical temperature to the supercritical HF 50.

Another example of an organic material is an aromatic hydrocarbon, such as SiLK® (Dow). This aromatic hydrocarbon may be solvated with a solvent 50+52 comprising supercritical $CO_2$ 50 to which a benzene-containing co-solvent 52 has been added. Again, the phase transition that effects formation of the film or membrane 60 may be brought about by adding a quantity of $CO_2$ below its supercritical temperature to the solvent 50+52.

Depending on the organic material of the structure 10, such as the layer 18 having a thickness of about 100 nm, and the composition of the solvent 50 or 50+52, the solvation time is selected until a small thickness of about 5-10 nm of the surface 16 or 22 and of the wall of the pore 14 is dissolved, following which the phase transition is effected to produce the film or membrane 60 having a thickness of about 5 nm. The solvation time, as well as the temperature and pressure of the process may be manipulated to produce a dense, non-porous film or membrane 60 having sufficient continuity to cover open pores 14 and sufficient additive mechanical strength, without adversely affecting other desirable properties of the structure 10 or the layer 18, such as the dielectric constant of the latter.

As used herein, the term "organic material" means the materials discussed above as well as materials related thereto and any porous polymers, polymer-based materials, or non-polymer-containing materials that may be solvated by a supercritical fluid 50 or 50+52 to produce the molecular cloud 56 that is capable of undergoing a temperature- and/or pressure-dependent or a non-solvent-driven phase transition to form the film or membrane 60. Additional exemplars of such an organic material are PTFE; SiLK, PsiLK, D SiLK, and J SiLK; polyethylene; polypropylene; aromatic hydrocarbon materials; polynuclear aromatic hydrocarbon materials; Flare 2.0™ (Allied Signal); Orion® (Trikon); LKD 5109® (JSR); XPX® (Asahi); and HSQ or HSSQ (hydrogen silsequioxane) and MSQ or MSSQ (methyl silsequioxane), both silicone-based polymers. Additional polymers and other materials may be selected by those skilled in the art. Exemplars of solvents 50 and 50+52 include $CO_2$, water, acids, nitrogen, argon, xenon, propane, ammonia, isopropanol, methanol, alcohol, ethers, acids, amines, DMSO (dimethylsulfoxide), NMP (N-methyl-2-pyrrolidone) and IPA [N-(3-methyl-2-butenyl) adenosine].

Particular embodiments of the invention are described herein. It is to be understood that the invention is not limited in scope thereby. The present invention includes the described embodiments and any modifications and equivalents covered by the following claims hereof.

What is claimed is:

1. A method of producing a very thin, dense film on a surface of a porous, organic material-containing structure having one or more pores open at its surface, the open pores rendering the surface non-smooth, comprising:

contacting the surface with a supercritical fluid that includes a solvent for the material under conditions sufficient to initiate solvation of the surface and of the walls of pores open at the surface; and then effecting a phase transition of the solvating organic material at the surface to form a thin, dense, pore-free film thereof on the surface, thereby covering the open pores and rendering the surface smooth.

2. A method as in claim 1, wherein the supercritical fluid is the solvent.

3. A method as in claim 1, wherein the supercritical fluid and the solvent are separate entities.

4. A method as in claim 3, wherein the supercritical fluid and the solvent contact the surface substantially simultaneously.

5. A method as in claim 3, wherein the solvent contacts the surface after initial contact thereof by the supercritical fluid.

6. A method as in claim 1, wherein the phase transition of the solvating organic material is effected by lowering the temperature or the pressure of the supercritical fluid or both.

7. A method as in claim 1, wherein the phase transition of the solvating organic material is effected by adding to the supercritical fluid a non-solvent for the material.

8. A method of producing a very thin, dense film on a surface of a porous, low-dielectric constant, organic material-containing layer having one or more pores open at its surface, the open pores rendering the surface non-smooth, comprising:

contacting the surface with a supercritical fluid that includes a solvent for the material under conditions sufficient to initiate solvation of the surface and of the walls of pores open at the surface; and then effecting a phase transition of the solvating material at the surface to form a thin, dense, pore-free film thereof on the surface, thereby covering the pores and rendering the surface smooth, the dense film being sufficiently thin so as to not significantly increase the dielectric constant of the layer.

9. A method as in claim 8, wherein the supercritical fluid is the solvent.

10. A method as in claim 8, wherein the supercritical fluid and the solvent are separate entities.

11. A method as in claim 10, wherein the supercritical fluid and the solvent contact the surface substantially simultaneously.

12. A method as in claim 10, wherein the solvent contacts the surface after initial contact thereof by the supercritical fluid.

13. A method as in claim 8, wherein the phase transition of the solvating organic material is effected by lowering the temperature and/or pressure of the supercritical fluid.

14. A method as in claim 8, wherein the phase transition of the solvating organic material is effected by adding to the supercritical fluid a non-solvent for the material.

* * * * *